ALLOY COATING FOR ELECTRICAL CONDUCTORS

INVENTOR.
KEITH ERIC OXFORD
BY
Christie, Parker & Hale
ATTORNEYS

Dec. 17, 1968 K. E. OXFORD 3,416,958

ALLOY COATING FOR ELECTRICAL CONDUCTORS

Filed Feb. 25, 1966 2 Sheets-Sheet 2

INVENTOR.
KEITH ERIC OXFORD
BY
Christie, Parker & Hale
ATTORNEYS

United States Patent Office 3,416,958
Patented Dec. 17, 1968

3,416,958

ALLOY COATING FOR ELECTRICAL CONDUCTORS

Keith Eric Oxford, San Diego, Calif., assignor to Lear Siegler, Inc., Santa Monica, Calif., a corporation of Delaware Filed Feb. 25, 1966, Ser. No. 530,168
10 Claims. (Cl. 117—212)

This invention relates in general to a new and improved method and apparatus for preparing electrical conductors such as are commonly found on printed circuit boards and other electrical holders. In particular, this invention relates to new and improved methods and apparatus for coating easily corroded conductors, and at the same time providing a compatible soldering base without discoloring, cracking, or otherwise damaging the circuit boards for the electrical conductors.

The employment of printed circuit boards for housing electrical conductors has now become commonplace in electronics. Such printed circuit boards are used both in automated processes wherein machine soldering of components to the board is accomplished automatically, and wherein hand soldering is also employed to solder components to circuit boards. Stringent requirements have been established as acceptable for the dimensions of the boards, as well as for the dimensions and tolerances of electrical conductors and the solder coatings on the electrical conductors. In particular, when such printed circuitry is to be employed in space flight, the standards are extremely rigid and provide small margins for error.

For purposes of example of one such stringent standard, reference is made to the National Aeronautics and Space Administration requirements for printed circuit design and construction, MSFC–STD–154, issued Mar. 29, 1963. This manual describes one common and accepted prior art approach. In this prior art approach the printed circuit board with conductors is held in a slinger mechanism and is dipped first in flux and thereafter dipped for three to five seconds in a hot solder bath maintained at approximately 450° to 500° Fahrenheit. The board, while still immersed, is moved to a location of the bath which has a thin film of peanut oil floating on top of the solder bath and thereafter the board is removed by lifting it through the thin film of peanut oil. The board once free of the bath is slung in a hand or machine slinger so as to remove excess solder. This slinging operation must establish a solder coating on the conductive surface of the printed circuit board which shall be 0.0015 inch thick, with a plus or minus tolerance of 0.0005 inch.

In the foregoing prior art operation, numerous disadvantages exist which, for a long time prior to the advent of this invention have remained unsolved. For example, the very presence of peanut oil on the solder bath is entirely unsatisfactory. It may catch fire or otherwise seriously burn employees. It discolors many circuit board materials. It is hard to remove from the circuit boards in subsequent washings, with the result being that such boards often fail to pass standards for cleanliness.

Another disadvantage of the prior art slinger or centrifuge approach for removing excess solder is that the final coating thickness within the specified requirements, is extremely hard to achieve. Machine slingers which have controllable spinning speeds are better than the hand slinger but often warp, crack and otherwise damage the circuit boards. Failure to meet the extreme resuirement for the thickness of the solder coating results in an unprecedented number of boards which are rejected whether they are slung by hand or machine.

The centrifuge approach of the prior art exhibits another serious disadvantage which prior to the advent of this invention had not been solved. Complex circuit patterns with conductors close together are often printed on circuit boards to conserve weight, size, and space. In the hand slinging or machine slinging operation, small globules of excess solder tend to become lodged at such closely spaced electrical conductors. These lodged solder particles act as short circuits between two different printed electrical circuits which are meant to be electrically insulated from each other by the non-conductive circuit board. These short circuits thus destroy the printed circuit layout and make the board unacceptable. Because of these short circuit hazards, printed circuit boards are subjected to an unprecedented number of quality control inspections, which inspections increase the costs for such boards and extend the manufacturing time per board.

Components are fastened to a printed circuit board, normally in holes provided in the conductor and board material. These holes may be punched, drilled and left vacant, or annealed copper eyelets are often housed in the holes. Such eyelets are pressed fit to the conductors in the board and in the past have been subjected to hand soldering operations in order to assure a complete coated bond between the copper eyelets and the printed conductor. This hand operation is highly unsatisfactory and uneconomical as well. Such prior art approaches described above, often leave the holes and the eyelets filled with solder, thus imposing a barrier to the insertion of components to be soldered to the board.

The foregoing disadvantages of the prior art are avoided by the new and improved method and apparatus of this invention. In accordance with the principles of this invention, a configuration of electrically conductive metal is provided on a non-conductive holder or board. A non-corrosive alloy metal having the characteristic of bonding to the surface of the configured conductive metal is applied to the surface of the conductive metal. A fluid capable of being maintained in a hot liquid form at a temperature above the melting point of the alloy material and below the higher melting point of the bond between the alloy and the electrical conductor is applied to the printed circuit board so that the alloy in excess of the required coating thickness is melted and flushed away from the configured metal. This alloy-immiscible fluid is further characterized as chemically non-reactive with either the alloy, the configured metal, or the circuit board material. One typical fluid, possessing these desired characteristics, which has proved extremely useful in this invention is a polyethylene glycol base with anti-oxidizing additives. At room temperatures this compound is in dry crystal form and becomes liquid when heated. This hot liquid is water soluble and thus requires only a simple water spray as the final cleansing operation for the printed circuit board. Furthermore, this hot liquid is essentially odorless and non-toxic. It has a high flash point and may be maintained at a required temperature above the melting point of the alloy and below the melting point of the alloy metal bond without fear that it will become ignited as has the peanut oil in the prior art apparatus.

The apparatus of this invention includes a tank for holding a non-toxic, water soluble liquid which is alloy-immiscible. Heating elements associated with the tank heat this liquid to the desired temperature and maintain it at that temperature. Immersed within the heated fluid is a pump for forcing the liquid through pipes which terminate in spray heads above the level of the liquid. These spray heads are located near the top of the tank which is closed except for an opening which allows the board to be subjected to the spray. This opening is designed to protect an operator when the printed circuit board is introduced in to the tank. The alloy-immiscible fluid at the selected temperature melts and flushes away all solder in excess of the desired thickness of alloy coating.

The foregoing features and advantages of this invention may be more fully appreciated by reference to the accompanying drawings in which.

Figures 1, 2:
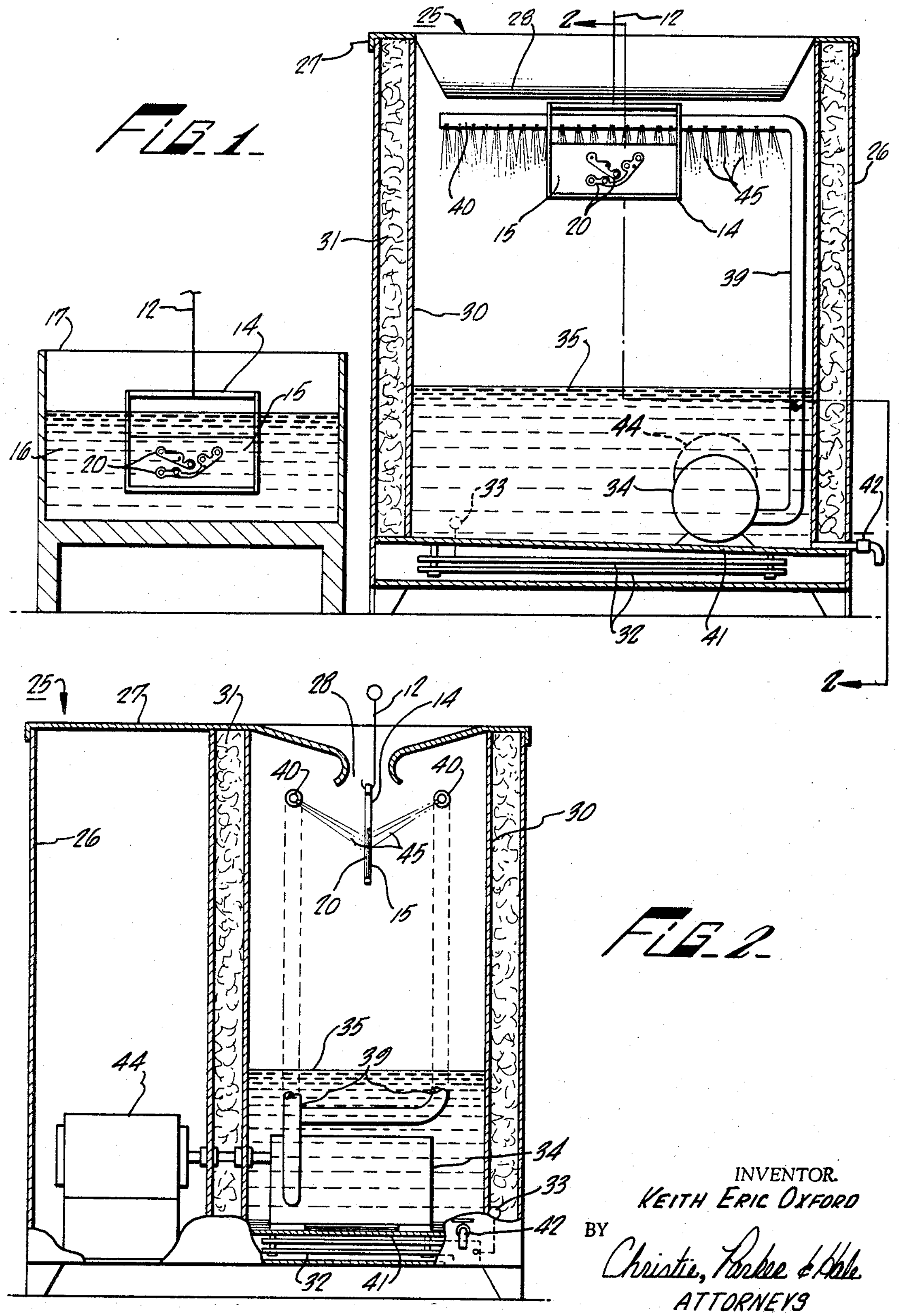
FIG. 1 is a front view of a molten alloy tank and spray tank in accordance with the principles of this invention.
FIG. 2 is a side elevation partially broken away of the spray tank along line 2—2.

Turning now to FIG. 1, a hook 12 and frame 14 for holding a printed circuit board 15 are shown. Boards 15 may be, in one embodiment of this invention, inserted into a hot alloy, or molten solder, bath 16 contained in a first tank 17. This alloy, or molten solder 16, may be any well-known solder such as a tin-lead mixture which consists of a composition of SN60 or SN63, as typical examples. Such solder 16 is characterized as being non-corrosive when compared with a typical electrical conductor such as copper configuration 20 on the printed circuit board 15. Solder 16 is further characterized in that it provides an excellent base for soldering components to the conductor 20 on printed circuit board 15.

No attempt has been made in the diagram of FIG. 1 to depict certain preliminary steps which are well-known in the art and not characteristic of this invention. Such steps include cleaning the circuit board 15 and the configured metal 20 with a neutral agent such as warm demineralized water and drying the board 15 so that it is oil and moisture free before inserting it into the solder bath 16.

Printed circuit board 15 of FIG. 1, once cleaned, by hand or by any well-known automatic conveyor system, is dipped into the molten solder for approximately 3 to 5 seconds, depending upon the desired final thickness for the alloy coating. Molten solder 16 in tank 17 is maintained at a temperature of approximately 450° to 500° Fahrenheit, which temperature is sufficient to cause the molten solder to form an alloy bond with the upper skin or surface of configured electrically conductive metal 20. When the board has been subjected to the molten solder for the required time interval, it is removed and transported either by hand or by a conveyor to the excess solder removing spray bath apparatus 25 of this invention. In the interim between the molten solder tank 16 and the spray bath apparatus 25, some excess solder is removed by normal dripping caused by shaking or vibrating board 15.

Spray apparatus 25 includes an outer metal container 26 having a top cap 27 which includes an opening 28 for receiving boards such as board 15. An inner fluid-tight tank 30, insulated by any well-known insulation 31, is located within outer container 26. Insulation 31, surrounding tank 30, aids in temperature regulation for fluid 35. Electric heating elements 32 are fastened along the bottom of tank 30 which heating elements may be controlled by a settable thermostat 33 so that a desired temperature for fluid 35 is achieved and maintained.

Reference to FIG. 2 which is a side elevation of FIG. 1 along line 2—2, shows the spray apparatus 25 in more detail. Located inside tank 30 is a pump 34. This pump 34 may be any well-known type pump which is capable of developing suitable hydrostatic pressure of approximately 100 pounds per square inch for one typical operation. An electrical motor 44 or other suitable drive is attached through a coupling and a fluid-tight seal to gear pump 34 to provide the required hydrostatic pressure in pump 34.

Pump 34 is covered by fluid 35, which fluid is maintained at a predetermined temperature by heating elements 32 and thermostat 33. Immersing pump 34 in fluid 35 assures that solder which is removed by the solder leveling apparatus of this invention remains in molten condition even if it should be recirculated. Of course, molten solder globules in the solder-immiscible fluid 35 soon join with other solder globules and became sufficiently heavy to run down the slanted bottom 41 of the tank 30 where the molten solder may be removed at will through drain 42 and re-used in solder tank 17. In addition, submerging pump 34 in fluid 35 assures no more than negligible loss of temperature of the fluid 35 while it is being circulated through pipes 39 and 40. Vertical pipes 39 and horizontal pipes 40 are more clearly shown in FIG. 1. Horizontal pipes 40 extend along the width of tank 30. Each one of the pair of horizontal pipes 40 are provided with openings for projecting fluid 35 into two sheet sprays 45. The sprays 45 intersect below and approximately at the midpoint of opening 28. Circuit board 15, which is shown held by a hook 12, FIG. 2, is moved vertically in and out of the intersection of the sheet sprays 42 by hand or by any well-known automatic operation.

Figure 3:
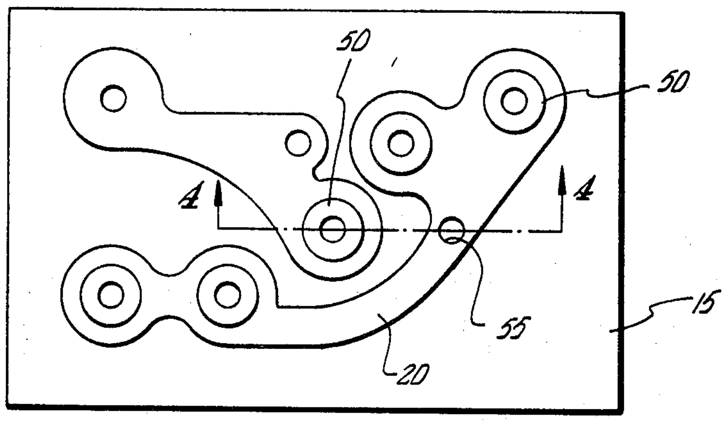
FIG. 3 is a plan view of a typical circuit board with a metal electrical conductor configuration including holes and eyelets for component connection to the circuit configuration.
Figure 4:
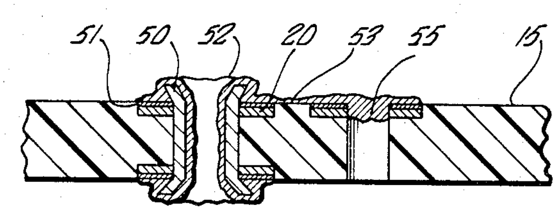
FIG. 4 is a section view taken along the line 4—4 of FIG. 3 after the board has been dipped in a molten solder bath and before excess solder is removed in accordance with the principles of this invention.
Figure 5:
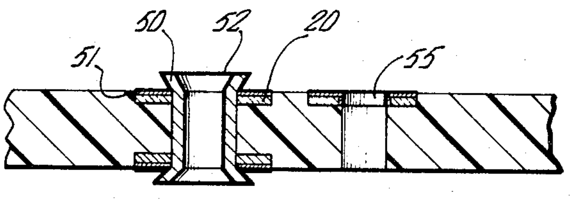
FIG. 5 shows the section 4—4 of the circuit board of FIG. 3 with excess solder removed by the method and apparatus of this invention.

Circuit board 15, FIG. 3, may be any non-conductive material as known in the art. For example, some typical printed circuit boards include materials such as laminated glass epoxies, phenolic and various grades of paper epoxies. As shown more clearly by reference to FIG. 3 board 15 may include a wide variety of conductive metal configurations. These configurations vary in shape according to the electrical interconnections required for various components that are to be subsequently mounted on the printed circuit board 15. These components are often attached to the conductive configuration, such as, a copper configuration, by the use of annealed copper eyelets 50. When board 15 is dipped into the molten solder bath 16 of tank 17, the solder 16 forms a thin surface bond 51, FIG. 4, on the upper exposed portion of the copper conductor 20. It is believed that such surface bond 51, once formed, exhibits a melting point which is higher than the melting point of the solder alone, in part because the conductor has a much higher melting point and partially because the copper conductor 20 acts as a heat sink. As shown in the elevation of FIG. 4 taken along line 4—4 of FIG. 3, excess solder 52 clings to the upper bond surface 51 created between the conductor and solder, and some excess solder 52 extends out beyond the area of the copper surface. This excess solder 52 adds to the weight of the board and tends to run together and cause shorts such as that shown at 53 between eyelet 50 and the adjacent opening 55. This excess solder is only partially and ineffectively removed by the prior art techniques.

In accordance with this invention, the excess solder is removed to the required depth by the fluid 35, FIG. 2, of this invention which is forced against the circuit board 15 in the intersecting sheet sprays 45 from spray heads 40. Fluid 35 of this invention may take different forms. Preferably fluid 35 is soluble in a non-reactive agent for the boards such as water or alcohol so that fluid 35 may be easily and economically rinsed off board 15 once the solder leveling step has been accomplished. Preferably fluid 35 is chemically non-reactive with solder 52, the conductor material 20, and the material of board 15.

Although various products have been tried with different degrees of success, one product which is preferable is polyethylene glycol either alone or treated with antioxidants so that it does not become degenerated or contaminated during the spraying operation. Polyethylene glycol 4000 or 6000, to pick a specific example, exhibits low toxic qualities and the personnel handling the circuit board are not subjected to offensive odors or poisonous or obnoxious vapors. Such glycols at room temperatures are in the form of dry crystals which may be easily stored in containers and sacks and is readily available for ease in loading the spraying apparatus 25 of this invention.

Polyethylene glycol 4000 has a high melting point and has a flash point which is well above the highest temperature required for the spraying operation of this invention.

Numerous anti-oxidants are available for mixture with the polyethylene glycol. One additive which is suitable is hydroquinone. It is also crystalline in form at low temperatures and is soluble in water or alcohol and thus may be easily flushed from the finished board. It is not toxic and the addition of approximately one ounce to fifty pounds of polyethylene glycol 4000 has proved satisfactory as an anti-oxidant which achieves economic reusability of the polyethylene glycol 4000. Another anti-oxidant which is acceptable either alone or in combination with the hydroquinone is mercaptobenzothiazole. It also is a non-toxic dry chemical at room temperature. When mercaptobenzothiazole is used as the only anti-oxidant for the polyethylene glycol, approximately one-half ounce to fifty pounds of glycol is satisfactory. If used in conjunction with the hydroquinone, then the mixture should be two ounces of hydroquinone and slightly less than one-half ounce mercaptobenzothiazole for every fifty pounds of polyethylene glycol 4000. There are obviously other chemicals and specifically other polymers of ethylene glycol which exhibit the foregoing characteristics and are thus within the principles and teachings of this invention.

To briefly review a complete process of this invention, the steps include preparing an electrically conductive configuration on a non-conductive board. This metal configuration may include eyelets or holes for component connections. The printed circuit board is placed in a board holder and dipped in a molten solder bath whereby the solder forms a surface bond with the conductor so that the conductor is coated with the solder alloy. The board, preferably with some surplus solder removed either by natural drainage or vibration is immersed within a sheet spray of hot solder-immiscible polyethylene glycol fluid. The board is pushed down below the point of impingement by the sheet sprays and is then slowly withdrawn in a manner which subjects it to a hydro squeegee action. Moving the board up and down at the junction of the sheet spray allows the spray to impinge evenly on both sides of the board whereby the excess solder which is not fully bonded to the conductor is melted and thus washed away. The excess solder once removed is maintained in a molten state by the high temperature of the polyethylene glycol fluid and it may be subsequently drained off through a tap or otherwise recovered. The final step requires that the board with excess solder removed be cleaned with a suitable agent such as demineralized water or alcohol to wash off any polyethylene glycol fluid present on the board.

The process of this invention has been described in connection with the use of molten solder bath and a polyethylene spray. In its broader aspects it is by no means limited to this technique of joining solder to the electrically conductive metal. For example, techniques in the past have included the use of electro-plating which does not form an alloy metal bond, as such. In electroplating a base metal such as a copper conductor is fused to a common printed circuit board of the types referred to hereinbefore. Subsequently a layer of solder is electroplated to the exposed copper surface on the board in a manner more typically referred to as a junction of two layers, one of copper and one of solder. It is recognized that the solder layer very often peels off from the copper surface due to any contamination which may have existed on the copper prior to electro-plating. In accordance with this invention, when the electro-plated board is immersed in a static or subjected to a sheet spray bath of heated solder-immiscible polyethylene glycol, the molecular layers intermix in a non-peelable surface bond.

It is to be understood that the foregoing features and principles of this invention are merely descriptive, and that many departures and variations thereof are possible by those skilled in the art, without departing from the spirit and scope of this invention.

What is claimed is:

1. A process for forming an alloy coating on an electrically conductive metal, said process comprising the steps of:

(a) submerging the electrically conductive metal in a molten alloy having the characteristic of interacting with the metal to form a surface bond therewith, said surface bond characterized by a melting temperature higher than the melting temperature of the alloy;
(b) heating an alloy-immiscible fluid to a predetermined temperature higher than the melting temperature of said alloy and lower than the melting temperature of the metal and alloy surface bond; and
(c) applying said fluid at said predetermined temperature to said alloy on said conductive metal to melt and flush away alloy material in excess of a uniform coating including at least the surface bond.

2. The alloy-coating process of claim 1, further characterized in that:

(a) said fluid applying step comprises impinging a spray of said alloy-immiscible fluid on said conductive metal.

3. The alloy-coating process of claim 1 and further characterized in that:

(a) said fluid is polyethylene glycol fluid which is characterized as:
  (1) crystalline in form at room temperature and liquid in form at least in said temperature range;
  (2) having a flash point higher than said selected temperature;
  (3) chemically non-reactive with said alloy and said metal; and
  (4) optionally including anti-oxidant additives for protecting the fluid from degeneration and contamination during the spraying operations.

4. An alloy-coating process for a metal configuration on a circuit board comprising the steps of:

(a) plating a desired thickness of alloy on the metal configuration;
(b) heating an alloy-immiscible fluid, characterized as non-reactive with said alloy, said metal and said board, to a fusing temperature of said alloy and metal, said fusing temperature selected from a range of temperatures between the melting temperature of the alloy and the higher melting temperature of an alloy-conductor intermetallic surface bond; and
(c) exposing said board to said fluid in a static or spray bath for fusing said alloy of predetermined thickness to said metal.

5. A process for forming an alloy coating on an electrically conductive metal configured on a non-conductive circuit board, said process comprising the steps of:

(a) exposing the electrically conductive metal to a molten alloy to form an alloy coating of uncontrolled thickness on said metal;
(b) heating an alloy-immiscible fluid which is chemically non-reactive with the circuit board to a predetermined temperature higher than the melting temperature of said alloy and lower than the melting temperature of an alloy-conductor intermetallic surface bond; and
(c) spraying said fluid at said predetermined temperature on said conductive metal to melt and flush away alloy material in excess of a predetermined coating thickness.

6. A process for forming an alloy coating on metal, said process comprising the steps of:

(a) exposing the metal to a molten alloy to form an intermetallic bond of alloy and metal together with an excess alloy coating of uncontrolled thickness on said metal;
(b) heating an alloy-immiscible and substantially water soluble liquid to a temperature at least substantially the melting temperature of said alloy and less than the melting temperature of the intermetallic bond; and (c) applying said liquid under pressure and at said predetermined temperature in a sheet spray against the alloy coating of uncontrolled thickness to melt and flush away alloy material in excess of a desired alloy thickness, which desired alloy thickness includes at least said intermetallic bond.

7. An alloy coating process comprising the steps of:

(a) plating a desired thickness of alloy on a metal configuration to be coated;

(b) heating an alloy-immiscible liquid characterized as water soluble and non-reactive with said alloy and said metal to a fusing temperature of said alloy and metal, said fusing temperature selected from a range of temperatures between the melting temperature of the alloy and the higher melting temperature of an alloy-conductor intermetallic surface bond; and (c) exposing said plated metal configuration in a static bath or sheet spray of said liquid for fusing an intermetallic boundary between the alloy and the metal.

8. A method for forming a uniform and substantially non-peelable coating of an alloy on a printed metal circuit conductor which has been exposed to the alloy and which is configured on a printed circuit board comprising the steps of:

(a) placing a chemical substance crystalline in form at room temperature in a heatable chamber, said substance being characterized:

(1) as capable of assuming a liquid state at a temperature above room temperature and less than the melting temperature of the alloy, (2) and in the liquid state further characterized as:

(a) alloy-immiscible, (b) chemically inert with respect to the alloy, the printed circuit conductor, and the printed board, (c) essentially water soluble, and (d) possessing a flash point substantially above the melting temperature of the alloy;

(b) heating said crystalline-form chemical until it becomes liquid, and thereafter further heating and maintaining said liquid at a higher predetermined temperature which is selected from the range of temperatures between the melting temperature of the alloy and the melting temperature of an alloy-conductor intermetallic bond; and (c) impinging a spray of said liquid at substantially the selected temperature against said printed circuit board to form said uniform and non-peelable coating.

9. A process in accordance with claim 8 wherein:

said printed circuit configuration includes metal eyelets or metal plated-through holes in the board for receiving terminal pins of components to be mounted on the board;

said liquid spraying step further comprises:

directing at least one sheet spray against the printed circuit metal configuration under sufficient pressure to remove any excess solder from within said eyelets or plated-through holes, and leaving a substantially uniform and non-peelable alloy coating therein.

10. A process in accordance with claim 9 wherein said liquid spraying step further comprises the step of:

directing equal and opposite intersecting sheet sprays on opposite sides of the printed circuit board with sufficient pressure to form intermetallic boundaries and to remove any excess alloy from within said eyelets or plated-through holes.

References Cited

UNITED STATES PATENTS 2,565,918 8/1951 Haas et al. ------- 117—102 X

FOREIGN PATENTS 520,890 1/1956 Canada.

WILLIAM L. JARVIS, *Primary Examiner.*

U.S. Cl. X.R.

117—10, 102, 114, 131, 217, 230